United States Patent
Frank

(10) Patent No.: US 8,635,418 B2
(45) Date of Patent: Jan. 21, 2014

(54) MEMORY SYSTEM AND METHOD FOR PASSING CONFIGURATION COMMANDS

(75) Inventor: Ingolf E. Frank, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/554,897

(22) Filed: Jul. 20, 2012

(65) Prior Publication Data

US 2013/0046923 A1  Feb. 21, 2013

(30) Foreign Application Priority Data

Jul. 22, 2011 (DE) .......... 10 2011 108 172

(51) Int. Cl.
- *G06F 12/00* (2006.01)
- *G06F 13/00* (2006.01)
- *G06F 13/28* (2006.01)
- *G11C 8/00* (2006.01)
- *G11C 8/18* (2006.01)

(52) U.S. Cl.
USPC . 711/156; 711/105; 365/230.01; 365/230.06; 365/230.08; 365/233.14

(58) Field of Classification Search
None
See application file for complete search history.

(56) References Cited

U.S. PATENT DOCUMENTS

| | | |
|---|---|---|
| 2005/0007835 A1 | 1/2005 | Lee et al. |
| 2005/0144369 A1 | 6/2005 | Jaspers |
| 2006/0248260 A1* | 11/2006 | Kuzmenka et al. ............ 711/1 |
| 2006/0259711 A1 | 11/2006 | Oh |
| 2009/0141564 A1 | 6/2009 | Pax |
| 2010/0027358 A1 | 2/2010 | Lee |
| 2010/0115217 A1 | 5/2010 | Oh et al. |
| 2011/0156934 A1 | 6/2011 | Bae et al. |

OTHER PUBLICATIONS

DE Search Report mailed Jun. 11, 2011.
JEDEC Standard, DDR2 SDRAM Specification, JEDEC Solid State Technology Association, JESD79-2B (Rev. of JESD79-2A) (Could not locate JESD79-2A).
PCT Search Report mailed Jan. 17, 2013.

* cited by examiner

*Primary Examiner* — Christian P Chace
*Assistant Examiner* — Gary W Cygiel
(74) *Attorney, Agent, or Firm* — Alan A. R. Cooper; W. James Brady, III; Frederick J. Telecky, Jr.

(57) ABSTRACT

A memory system is provided. In the system, there are first and second sets of dynamic random access memories (DRAMs) and a system register. Each DRAM has at least a first and a second addressable mode register, where the binary address of the second mode register is the inverted binary address of the first mode register. The system register has an input configured to be coupled to a controller, an output coupled to the first set of DRAMs via first address lines and an inverted output coupled to the second set of DRAMs via second address lines. The system register is configured to receive mode register set commands including address bits and configuration bits at the input and to output the mode register set commands non-inverted via the output to the first set of DRAMs and in inverted form via the inverted output to the second set of DRAMs.

8 Claims, 2 Drawing Sheets

|  | ADDRESS BITS | CONFIGURATION BITS |
|---|---|---|
| FIRST COMMAND | | |
| INPUT 20 | 0001 | 111111111111 |
| OUTPUT 26 | 0001 | 111111111111 |
| INVERTED OUTPUT 30 | 1110 | 000000000000 |
|  |  |  |
| SECOND COMMAND | | |
| INPUT 20 | 1110 | 000000000000 |
| OUTPUT 26 | 1110 | 000000000000 |
| INVERTED OUTPUT 30 | 0001 | 111111111111 |

FIG. 3

|  | ADDRESS BITS | CONFIGURATION BITS |
|---|---|---|
| INPUT 20 | 0001 | 111111111111 |
| OUTPUT 26 | 0001 | 111111111111 |
| INVERTED OUTPUT 30 | 1110 | 000000000000 |
| DRAMS SECOND GROUP | 0001 | 111111111111 |

FIG. 4

|  | ADDRESS BITS | CONFIGURATION BITS |
|---|---|---|
| INPUT 20 | 0111 | 101011111111 |
| OUTPUT 26 | 0111 | 101011111111 |
| INVERTED OUTPUT 30 | 1000 | 010100000000 |
| DRAMS BOTH GROUPS | NOP |  |

FIG. 5

MEMORY SYSTEM AND METHOD FOR PASSING CONFIGURATION COMMANDS

CROSS-REFERENCE TO RELATED APPLICATIONS

This application claims priority from German Patent Application No. 10 2011 108 172.4, filed Jul. 22, 2011, which is hereby incorporated by reference for all purposes.

TECHNICAL FIELD

The invention relates to a memory system and to a method for passing configuration commands. More specifically, the invention relates to a memory system comprising a system register and two sets or sets of dynamic random access memories (DRAMs). The invention further relates more specifically to a method for passing mode register set commands to addressable mode registers and to a method for sending register control words to a system register.

BACKGROUND

Memory systems are used for examples in computers, especially server computers, which require a large amount of memory. Such a memory system may comprise memory modules, which may be realized as dual inline memory modules (DIMM). A memory controller may drive the memory modules. The controller outputs must provide the required command/address signals (CA) to all related memory modules taking into account the capacitive and resistive loads and the required timing with respect to the clock signal.

So called registered memory modules comprise, additionally, a system register which relieves the load requirements on the memory controller. A registered DIMM, also called RDIMM, can hold several DRAM chips and uses an address/command register to offload the large amount of address line capacitance from the system.

In a registered DIMM, all commands must pass through the system register on the DIMM before going to the DRAM devices. Such commands may be to write or to read data.

According to the prior art, the system register in registered DIMMs uses address inversion in the DRAM address lines to one half of the memory modules or, in other words, to one set or one bank of DRAMs in order to reduce switching noise and to reduce termination currents into the motherboard termination voltage (VTT) regulator.

A memory system can be configured by configuration commands. Therefore, in registered DIMMs, the system register comprises one or more configuration registers and the DRAMs include one or more mode registers.

Configuration commands for the DRAMs are referred to as mode register set commands (MRS commands) and are sent to a memory to control; for example, various modes, initiate status updates and to perform other operations. An MRS command includes address bits to designate a mode register and configuration bits for the configuration data itself. In a DIMM or RDIMM, the same MRS command is to be sent to all DRAMs included in the DIMM, and in each DRAM to the same mode register address.

Thus, when configuring the DRAMs in a registered DIMM, the controller transmits an MRS command to the system register, which then transmits the command over all DRAM address lines to all DRAMs. In the case of registered DIMMS with address inversion, the MRS commands would be transmitted over the inverted and the non-inverted address lines. In order to send the same logic levels to all DRAMs simultaneously (according to the prior art), address inversion is disabled for sending the MRS commands.

Therefore, the system register must detect MRS commands going from the motherboard controller host to the DRAMs. This detection or decoding must be done in real time before information is propagated through the register.

Once an MRS command is detected, the system register blocks an associated chip select signal from propagating to the DRAM for the first of three cycles, it then disables address inversion and drives all signals with the same level to both sides. This increases switching noise and requires fast action from the register for blocking the chip select signal to the DRAM. Due to increased switching noise, the register needs to change its output timing from one clock per command (1T timing) to three clocks per command (3T timing) to give the signals more settling time. The mechanism increases the register complexity and has a disadvantage for the register's latency.

Configuration of the system register in a registered DIMM is performed (according to the prior art) by transmitting the information from the controller to the register using an access mechanism which is not utilized during normal operation. Normal access to a memory module is generally initiated by pulling a chip select signal low simultaneously with the address/command information on the address and command signal lines. The signal combination is captured by the system register and transferred to the DRAMs. As a memory module can be comprised of two so called ranks, each with its own chip select signal, each module needs a set of two chip select signals at its connection to the memory controller. During normal operation, both chip select signals are never pulled low simultaneously.

By pulling both chip select signals low simultaneously, the controller initiates a configuration write to the system register. This access must not be passed through to the DRAMs as the DRAMs would erroneously interpret it as a DRAM access. Therefore, the system register blocks access by keeping the chip select outputs high. This blocking is to be performed in real-time and limits the register performance.

SUMMARY

In one aspect of the invention, a memory system is provided which comprises a system register and a first and a second set of DRAMs. Each DRAM comprises at least a first and a second addressable mode register. The binary address of the second mode register is the inverted binary address of the first mode register. The system register comprises an input which is configured to be coupled to a controller. The system register comprises an output and an inverted output. The output is coupled to the first set of DRAMs via first address lines. The inverted output is coupled to the second set of DRAMs via second address lines.

The system register is configured to receive mode register set commands comprising address bits and configuration bits at the input. The system register is further configured to output the mode register set commands non-inverted via the output to the first set of DRAMs and to output the mode register set commands in inverted form via the inverted output to the second set of DRAMs.

In other words, address inversion is kept on while transmitting the MRS commands. It is therefore not necessary to detect in real-time transmission of MRS commands. The switching noise is decreased and the termination currents are reduced. It is not necessary for the output timing to be changed to three cycles per command (3T timing) to give the signals more settling time.

As another example, the memory system further comprises a controller. The controller may be configured to send to the system register each mode register set command followed by an inverted copy of the command. Further, the DRAMs may be configured to ignore any access to the second addressable mode register.

This means, for example, that the controller first sends a mode register set (MRS) command which comprises address bits designating a first mode register and configuration bits. The system register sends this first command non-inverted via the output to the first set of DRAMs which receives the configuration bits contained in the MRS command and stores them in the first mode register designated by the address bits. The system register also sends this first command inverted via the inverted output to the second set of DRAMs which receives the configuration bits contained in the MRS command in inverted form. However, the inverted address bits designate a second (dummy) mode register and therefore the DRAMS of the second set ignore the command.

The controller then sends the inverted copy of the command. Thus, the command comprises address bits designating a second addressable mode register because the binary address of the second mode register is the inverted binary address of the first mode register. The system register sends the inverted copy non-inverted via the output to the first set of DRAMs which receive the inverted copy of the original configuration bits. However, the address bits are also inverted, thus designating the second (dummy) mode register and therefore the DRAMS of the first set ignore the command. The system register also sends the inverted copy inverted via the inverted output to the second set of DRAMs which receive the configuration bits contained in the MRS command in their original form (inverted twice). The address bits contained in the MRS command are also inverted twice and thus in their original form designating a first mode register. The DRAMs of the second set will, therefore, store the configuration bits in the first mode register designated by the address bits.

After the two commands are sent, the first addressable mode registers in the DRAMs of both sets will have the same configuration bits stored. The second mode registers are ignored in both sets.

Address inversion can be kept on, and instead of the three-clock timing (3T timing), a two-clock timing (2T timing) is achieved.

In another example, the DRAMs may be configured to treat an access to the second addressable mode registers as an access to the first addressable mode registers with inverted configuration bits. According to this aspect of the invention, the controller sends the mode register set command only once.

This means that the system register receives, for example, a mode register set (MRS) command which comprises address bits designating a first mode register and configuration bits. The system register sends, via the output, the command non-inverted to the DRAMs of the first set which store the configuration bits contained therein in the first mode register designated by the address bits.

The system register sends, via the inverted output, the command in inverted form to the DRAMs of the second set. The inverted address bits will designate a second mode register and therefore the DRAMs of the second set treat the command as an access to the corresponding first mode register and store the configuration bits comprised in the MRS command in inverted form, thus in the original form. Afterwards, the first mode registers of both sets of DRAMs contain the same configuration bits.

Address conversion can be kept on, and instead of the three-clock timing (3T timing), a one-clock timing (1T timing) is achieved.

In another example, each DRAM can comprise a plurality of pairs of first and second addressable mode registers, wherein in a pair, the binary address of the second mode register may be the inverted binary address of the first mode register. For example, if there are eight pairs, in a first pair, the first addressable mode register has the binary address "0000" and the corresponding second addressable mode register has the address "1111", another pair would be "0001" and "1110", and so on.

In an example with eight pairs of mode registers per DRAM, eight different mode registers per DRAM may be used for different mode register settings, in the words of the invention, these are first mode registers. The other eight mode registers will not be used to store configuration data, in the words of the invention, these are second mode registers.

In another example, access to a specific one of the first addressable mode registers may be considered as "no operation performed" access by the DRAMs. Instead, the address of the specific one of the first addressable mode registers is used to send configuration information from the controller to the system register.

In an example with eight pairs of mode registers, per DRAM, an MRS command may comprise the address of the eighth of the first addressable mode registers "0111". The DRAMs may be configured to consider a command comprising this address as "no operation performed". The command may then comprise at the place of the configuration bits a register control word (RCW) address and a register control word as configuration data for the system register.

This configuration information may be used; for example, for a clock enable, a soft reset or a soft power down. Thus, it is not necessary to provide a dedicated pin for these functions, contrary to the prior art.

The present invention further provides a method for passing mode register set commands to addressable mode registers in a memory system. The memory system comprises a system register and a first and a second set of DRAMs. Each DRAM comprises at least a pair of first and second addressable mode registers, wherein the binary address of the second mode register is the inverted binary address of the first mode register.

The system register receives a mode register set command which comprises address bits and configuration bits. The system register sends the mode register set command to the DRAMs of the first set. The system register sends the mode register set command in inverted form to the DRAMs of the second set.

As an example, the system register receives the mode register set command a second time in inverted form. The system register may send the inverted mode register set command to the DRAMs of the first set. The system register may send the inverted mode register set command in inverted form to the DRAMs of the second set. The configuration bits comprised in the register set command will be stored in the first mode registers which are addressed in both sets of DRAMs.

In another example, the DRAMs are configured to invert the mode register set command if the address contained therein is the address of a second mode register. After inversion, the address is the address of a first mode register and the configuration bits are stored in the first mode registers addressed.

In an aspect of the invention, a method for sending register control words to a system register in a memory system is provided. The memory system comprises the system register and a first and a second set of DRAMs. Each DRAM comprises at least one pair of a first and a second addressable mode register. The binary address of the second mode register in a pair is the inverted binary address of the first mode register. The system register receives a mode register set command which comprises address bits and configuration bits. The address bits designate a specific one of the addressable mode registers which is considered as no operation performed (NOP) access by the DRAMs. The configuration bits comprise a register control word address and configuration data for the system register. The system register detects the address of the specific one of the mode registers. The system register stores the configuration data in the configuration register at the register control word address.

Thus, the system register does not need to block access by keeping chip select outputs high. No real-time blocking is necessary and the register performance is enhanced.

BRIEF DESCRIPTION OF DRAWINGS

For a more complete understanding of the present invention, and the advantages thereof, reference is now made to the following descriptions taken in conjunction with the accompanying drawings, in which:

FIG. 3 is an example table showing a simplified example of an MRS command and changes to the MRS command;

FIG. 4 is an example table showing a simplified example of an MRS command and changes to the MRS command; and FIG. 5 is an example table showing a simplified example of an MRS command used for configuration of the system register and changes to the command.

DETAILED DESCRIPTION OF EMBODIMENTS

Figure 1:
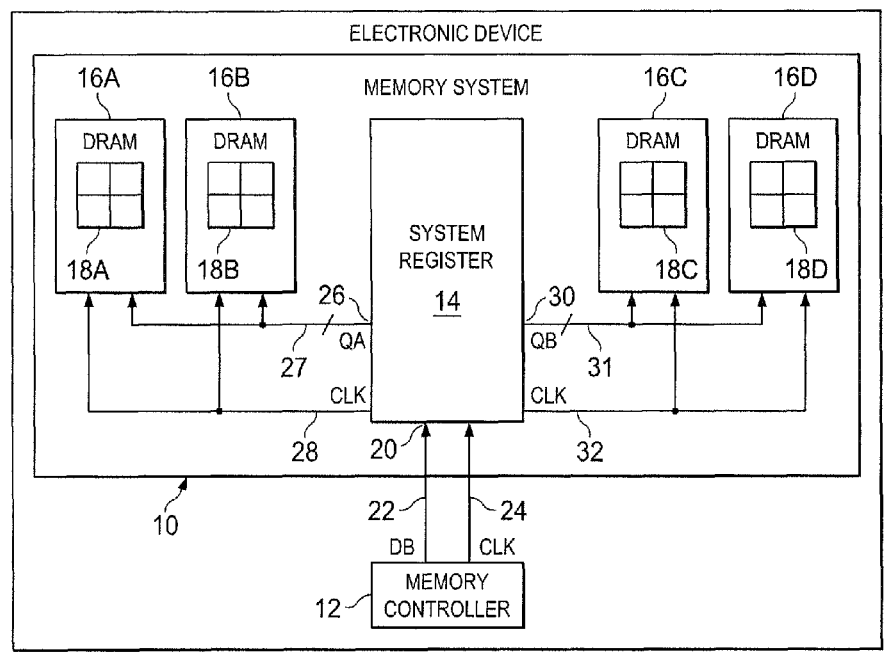
FIG. 1 is an example of a simplified and schematic diagram of a memory system.

FIG. 1 schematically represents an electronic device comprising a memory system 10 and a memory controller 12. In the example embodiment, memory controller 12 is not part of memory system 10. In other embodiments the controller may be included in the memory system.

Memory system 10 comprises a system register 14, a first set of dynamic random access memories (DRAMs) with DRAMs 16A and 16B and a second set of DRAMs with DRAMs 16C and 16D. Each DRAM 16A to 16D comprises multiple mode registers 18A to 18D respectively. There may be for example 16 mode registers in each DRAM, i.e. MR0 to MR15. There may be also only 8 mode registers in each DRAM. There are at least 2 mode registers in each DRAM. The mode registers may form pairs of mode registers, and more specifically pairs of first addressable mode registers and second addressable mode registers. In a pair the binary address of the second mode register may be the inverted binary address of the first mode register. It is to be understood that each DRAM comprises mode registers addressable under the same address. MR0 may have in each DRAM for example the binary address "0000" and MR15 the binary address "1111".

The memories 16A to 16D may be realized together with system register 14 on a dual inline memory module (DIMM) which may also be called RDIMM (registered DIMM). The memory system 10 shown in FIG. 1 comprises only one RDIMM which is controlled by memory controller 12. It should be clear for the person skilled in the art that memory controller 12 may control multiple memory modules each comprising a system register and a plurality of DRAMs with multiple mode registers each.

System register 14 comprises an input 20 which is connected by lines 22 with memory controller 12. Lines 22 may comprise DRAM bank address lines. Memory controller 12 is further connected to system register 14 by line 24 on which a clock is transmitted. Persons skilled in the art will realize that memory controller 12 may be connected, additionally, directly to DRAMs 16A to 16D by data and strobe lines. These connections are not important for the invention and are omitted for a simplified representation.

System register 14 comprises an output 26 which is coupled by first address lines 27 to the first set of DRAMs 16A and 16B. System register 14 is further connected with DRAMs 16A and 16B by a clock line 28.

System register 14 further comprises an inverted output 30 which is coupled by second address lines 31 to the second set of DRAMs 16C and 16D. System register 14 is further connected by a clock line 32 with DRAMs 16C and 16D. Each set of DRAMs may comprise more than two DRAMs.

In operation, binary mode register set (MRS) commands are sent from memory controller 12 to system register 14, via lines 22, as so-called DB signals. Lines 22 may be DRAM bank address lines. System register 14 may be configured to send the received MRS commands via output 26 as so-called QA signals in non-inverted form on lines 27 to DRAMs 16A and 16B and more specifically to mode registers 18A and 18B. Lines 27 may be DRAM bank address lines. System register 14 may be configured to send the received MRS commands via inverted output 30 as so-called QB signals in inverted form on lines 31 to DRAMs 16C and 16D and, more specifically, to mode registers 18C and 18D. Lines 31 may be DRAM bank address lines.

Figure 2:
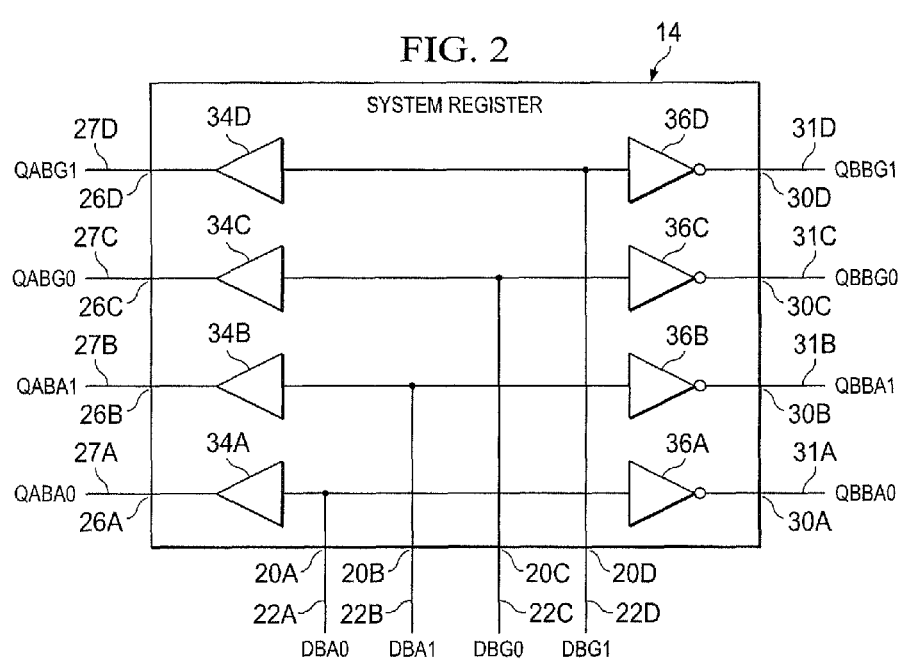
FIG. 2 is an example of a simplified and schematic diagram of a system register.

FIG. 2 shows system register 14 in more detail. Clock lines 24, 28 and 32 are not represented. System register 14 comprises four amplifiers 34A, 34B, 34C and 34D and four inverting amplifiers 36A, 36B, 36C and 36D. System register 14 further comprises four inputs 20A, 20B, 20C and 20D corresponding to input 20 shown in FIG. 1, which are connected to lines 22A, 22B, 22C and 22D respectively, corresponding to lines 22 in FIG. 1. DRAM bank address signals DBA0, DBA1, DBG0 and DBG1 are transmitted over lines 22A, 22B, 22C and 22D, respectively.

System register 14 further comprises four outputs 26A, 26B, 26C and 26D corresponding to output 26 shown in FIG. 1, which are connected to lines 27A, 27B, 27C and 27D, respectively, corresponding to lines 27 in FIG. 1. Output signals QABA0, QABA1, QABG0 and QABG1 are transmitted over lines 27A, 27B, 27C and 27D, respectively. System register 14 further comprises four inverted outputs 30A, 30B, 30C and 30D corresponding to output 30 shown in FIG. 1, which are connected to lines 31A, 31B, 31C and 31D, respectively. Output signals QBBA0, QBBA1, QBBG0 and QBBG1 are transmitted over lines 31A, 31B, 31C and 31D, respectively.

In operation, signal DBA0 is input to system register 14, via line 22A, and output on output 26A as output signal QABA0 which is transmitted to DRAMs 16A and 16B of the first bank or set of DRAMs. Signal DBA0 is further output in inverted form as signal QBBA0 at output 30A and transmitted to DRAMs 16C and 16D of the second set of DRAMs.

Signal DBA1 is input to register 14 at input 20B and transmitted, via output 26B, as signal QABA1 to DRAMs 16A to 16B and in inverted form via output 30B as signal QBBA1 to DRAMs 16C and 16D. Similarly, signals DBG0 and DBG1 are input to system register 14 and output in non-inverted form as signals QABG0 and QABG1 to DRAMs 16A and 16B and in inverted form as signals QBBG0 and QBBG1 to DRAMs 16C and 16D.

FIGS. 3 to 5 illustrate changes to an MRS command according to an embodiment of the invention. System register 14 receives at its input 20 a first MRS command from controller 12. The MRS command may comprise, as shown in the third line of the table in FIG. 3, address bits "0001" and configuration bits "111111111111". The command may be output at output 26 to the first set of DRAMs 16A and 16B non-inverted as shown in the next line of the table. The command may also be output at inverted output 30 to the second set of DRAMs 16C and 16D in inverted form, as shown in the fifth line of the table with an address "1000" and configuration bits "000000000000".

Then the controller 12 may send a second MRS command which is an inverted copy of the first MRS command. The address bits and configuration bits of the inverted copy are shown in FIG. 3 under the headline "second command". The command may be output non-inverted at output 26 to the first set of DRAMs 16A and 16B as shown in the next line of the table. The command may also be output at inverted output 30 to the second set of DRAMs 16C and 16D in inverted form, as shown in the last line of the table in FIG. 3.

The configuration bits comprised in the commands will only be stored at addresses of first mode registers. The address "0001" is an address of a first mode register, whereas the address "1110" is an address of a second mode register. Thus, after the first command, the configuration bits "111111111111" will be stored in all first mode registers having the address "0001" of the DRAMs of the first set. Nothing will be stored in the mode registers of the DRAMs of the second set because the address bits "1110" indicate a second mode register.

After the second command, the configuration bits "111111111111" will be stored in all first mode registers having the address "0001" of the DRAMs of the second set. Nothing will be stored in the mode registers of the DRAMs of the first set because the address bits "1110" indicate a second mode register.

After the two commands, all first mode registers with the address "0001" in all DRAMs of both sets will comprise the same configuration bits.

In another embodiment, an MRS command may only be sent once from controller 12 to system register 14. The MRS command may comprise, as shown in the second line of the table in FIG. 4, address bits "0001" and configuration bits "111111111111". The command may be output non-inverted at output 26 to the first set of DRAMs 16A and 16B as shown in the next line of the table. The command may also be output at inverted output 30 to the second set of DRAMs 16C and 16D in inverted form, as shown in the last but one line of the table.

According to the embodiment of the invention, the DRAMs are configured to detect whether the address comprised in the command is the address of a second mode register. In this case, the command will be inverted. Furthermore, the configuration bits comprised in the commands will only be stored at addresses of first mode registers.

Thus, the configuration bits "111111111111" will be stored in all first mode registers having the address "0001" of the DRAMs of the first set. The DRAMs of the second set will detect an address "1110" indicating a second mode register and thus invert the command as shown in the last line of the table in FIG. 4. Then, the DRAMs of the second set will store the configuration bits "111111111111" in all first mode registers having the address "0001".

In other words, all first mode registers with the address "0001" in all DRAMs of both sets will comprise the same configuration bits.

According to another embodiment of the invention, a register control word may be sent to the system register using an MRS command. Controller 12 may send an MRS command as indicated in FIG. 5, second line, comprising address bits "0111" and configuration bits "101011111111". The command may be output non-inverted at output 26 to the first set of DRAMs 16A and 16B as shown in the next line of the table. The command may also be output at inverted output 30 to the second set of DRAMs 16C and 16D in inverted form, as shown in the fourth line of the table. The address bits "0111" may designate a first mode register but is considered by all DRAMs as a "no operation performed" access. In other words, the DRAMs will not react to the command. The (inverted) address bits "1000" may designate a second mode register and will therefore not be considered by the DRAMs. However, the system register 14 may be configured to take the address bits "0111" as information that a register word is sent that means configuration information for the system register itself. Then, the first four bits of the configuration bits "0101" may be a register control word address and the further bits "11111111" may represent the configuration data for the system register itself.

According to the invention, the memory system may keep address inversion on during MRS access. Thus, signal integrity and the current of the VTT regulator are not disturbed. The voltage VTT is usually half of the operating voltage and therefore for example in the range of 500 mV to 600 mV. In prior art, address inversion had to be turned off and timing had to be changed from one clock per command to three clocks per command. In the case of multiple consecutive MRS commands, the memory system according to the prior art had to make sure that the VTT regulator was strong enough to support the large amount of outputs switching simultaneously to the same level. To the contrary, in a system according to the invention it is not necessary to oversize the VTT regulator to support the simultaneously switching of a large amount of outputs during MRS commands.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. A memory system comprising:
    first and second sets of dynamic random access memories (DRAMs), each DRAM having at least a first and a second addressable mode register, wherein the binary address of the second mode register is the inverted binary address of the first mode register; and
    a system register having an input configured to be coupled to a controller, an output coupled to the first set of DRAMs via first address lines and an inverted output coupled to the second set of DRAMs via second address lines, wherein the system register is configured to receive mode register set commands including address bits and configuration bits at the input and to output the mode register set commands non-inverted via the output to the first set of DRAMs and in inverted form via the inverted output to the second set of DRAMs, wherein the system further comprises a controller, wherein the controller is configured to send to the system register each mode register set command followed by an inverted copy of the command, and wherein the DRAMs are configured to ignore any access to the second addressable mode registers.

2. The memory system of claim 1, wherein the DRAMs are configured to treat an access to the second addressable mode registers as an access to the first addressable mode registers with inverted configuration bits.

3. The memory system of claim 1, wherein each DRAM comprises a plurality of pairs of first addressable mode registers and second addressable mode registers, wherein in a pair the binary address of the second mode register is the inverted binary address of the first mode register.

4. The memory system of claim 3, wherein access to a specific one of the first or second addressable mode registers is considered as no operation performed (NOP) access by the DRAMs and wherein the system register is configured to treat a mode register set command including the address of the specific one of the mode registers as configuration information for the system register.

5. The memory system of claim 4, wherein the configuration information comprises one out of clock enable (CKE), soft reset and soft power down.

6. A method for passing mode register set commands to addressable mode registers in a memory system, the memory system having a system register, and first and second set of DRAMs, each DRAM having at least one pair of first and second addressable mode register, wherein the binary address of the second mode register in a pair is the inverted binary address of the first mode register, the method comprising the steps of:

receiving a mode register set command including address bits and configuration bits by the system register;

sending the mode register set command from the system register non-inverted to the first set of DRAMs; and sending the mode register set command from the system registers in inverted form to the second set of DRAMs, receiving the mode register set command in inverted form by the system register;

sending the inverted mode register set command from the system register to the first set of DRAMs;

sending the inverted mode register set command from the system register in inverted form to the second set of DRAMs; and storing the configuration bits contained in the register set command in the first mode registers which are addressed.

7. The method of claim 6, wherein the method further comprises the steps of inverting in the DRAMs the mode register set command if the address contained therein is the address of a second mode register and storing the thus inverted configuration bits contained in the mode register set command in the first mode registers addressed.

8. A method for sending register control words to a system register in a memory system, the memory system having the system register, and first and second set of DRAMs, each DRAM having at least one pair of a first and a second addressable mode register, wherein the binary address of the second mode register in a pair is the inverted binary address of the first mode register; the method comprising the steps of:

receiving a mode register set command comprising address bits and configuration bits by the system register, wherein the address bits designate a specific one of the addressable mode registers, wherein access to the specific one of the addressable mode registers is considered as NOP access by the DRAMs, and wherein the configuration bits comprise a register control word address and configuration data for the system register;

detecting the address of the specific one of the mode registers in the system register; and storing the configuration data in the system register at the register control word address.

* * * * *